(12) United States Patent  
Noda et al.

(10) Patent No.: US 7,559,469 B2
(45) Date of Patent: Jul. 14, 2009

(54) CHIP CARD OF REDUCED SIZE WITH BACKWARD COMPATIBILITY AND ADAPTER FOR A REDUCED SIZE CHIP CARD

(75) Inventors: Chie Noda, Munich (DE); Atsushi Murase, Munich (DE); Hidetoshi Ishikawa, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 568 days.

(21) Appl. No.: 10/515,774

(22) PCT Filed: May 24, 2002

(86) PCT No.: PCT/EP02/05740

§ 371 (c)(1),
(2), (4) Date: Jun. 27, 2005

(87) PCT Pub. No.: WO03/100720

PCT Pub. Date: Dec. 4, 2003

(65) Prior Publication Data

US 2005/0231921 A1  Oct. 20, 2005

(51) Int. Cl.
*G06K 7/06* (2006.01)
(52) U.S. Cl. .................. 235/441; 235/486; 361/737; 257/679; 902/26
(58) Field of Classification Search .......... 235/441, 235/486; 361/737; 257/679; 902/26
See application file for complete search history.

(56) References Cited

U.S. PATENT DOCUMENTS 5,736,781 A * 4/1998 Atsumi .................. 257/679
5,975,584 A * 11/1999 Vogt .................... 283/98
6,151,511 A * 11/2000 Cruciani ................ 235/486
6,193,163 B1 * 2/2001 Fehrman et al. ........... 235/441
6,561,432 B1 * 5/2003 Vedder et al. ............ 235/492
6,641,049 B2 * 11/2003 Luu .................... 235/492
6,817,534 B2 * 11/2004 Gray .................... 235/492

(Continued)

FOREIGN PATENT DOCUMENTS

DE  198 26 428 A1 * 12/1999

(Continued)

OTHER PUBLICATIONS

Invitation to Pay Protest Fee (mailed Sep. 2, 2004).

(Continued)

*Primary Examiner*—Michael G Lee
*Assistant Examiner*—Kristy A Haupt
(74) *Attorney, Agent, or Firm*—Edwards Angell Palmer & Dodge LLP; John J. Penny, Jr.

(57) ABSTRACT

To achieve backward compatibility for smaller chip cards, in particular to legacy card readers/writers or legacy mobile terminals, according to the present invention a smaller chip card comprises a card body and a first contact area (14) with dimensions and locations of contacts according to predefined standard. An integrated circuit chip (36) is, firstly, physically and electrically connected to contacts of a second contact area (38), where the locations of contacts in the second contact area (38) are different from locations of contacts in the first contact area (14). According to the present invention, the integrated circuit chip (36) is also connected to contacts in the first contact area (14).

14 Claims, 12 Drawing Sheets

U.S. PATENT DOCUMENTS 6,964,377 B1 * 11/2005 Haghiri et al. ............... 235/492
7,183,636 B1 * 2/2007 Boccia et al. ............... 257/679

FOREIGN PATENT DOCUMENTS

| DE | 198 26 428 A1 | 12/1999 |
| DE | 199 22 063 A1 | 11/2000 |
| DE | 199 26 348 A1 | 12/2000 |
| EP | 0 052 590 | 4/1985 |
| EP | 0 328 124 B1 | 10/1996 |
| EP | 1 052 590 A1 | 11/2000 |
| EP | 1 077 578 A1 * | 2/2001 |
| FR | 2 771 199 | 5/1999 |
| FR | 2 794 264 | 12/2000 |
| FR | 2 885 718 A1 * | 11/2006 |
| JP | 62-255192 | 11/1987 |
| JP | 4-153097 | 5/1992 |
| JP | 5-229292 A * | 9/1993 |
| WO | WO 00/73989 A1 * | 12/2000 |

OTHER PUBLICATIONS

"Handbuch der Chipkarten," pp. 56-61 (1999).
International Search Report dated Apr. 11, 2003.
International Preliminary Examination Report dated Sep. 3, 2004.
European Search Report dated Dec. 6, 2005.

* cited by examiner

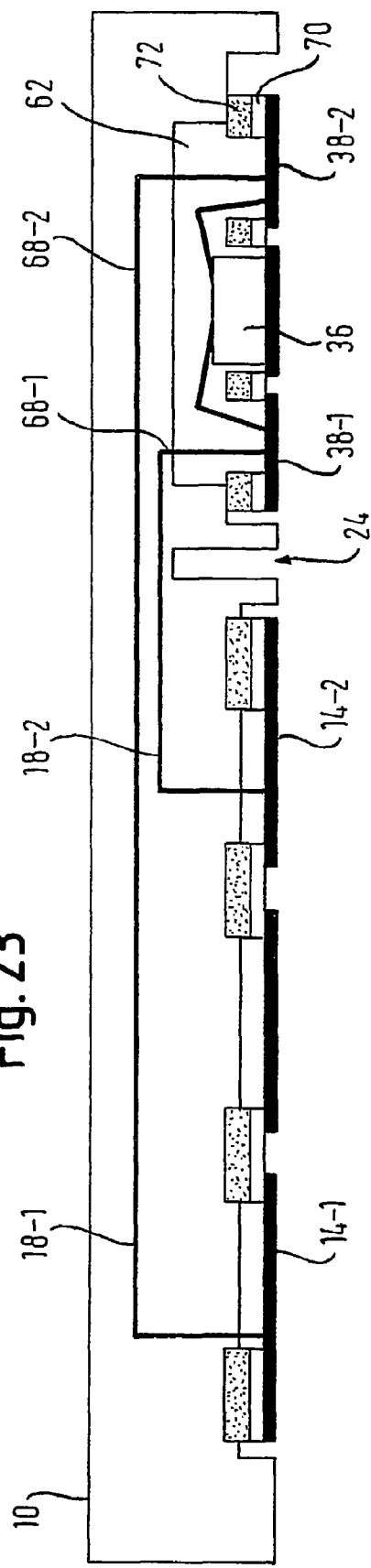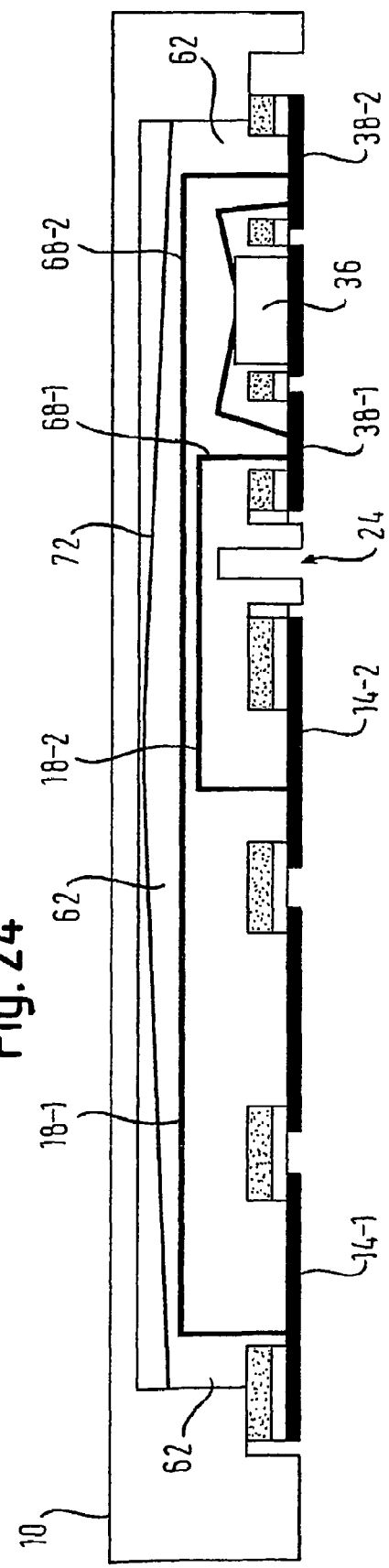

Fig. 25
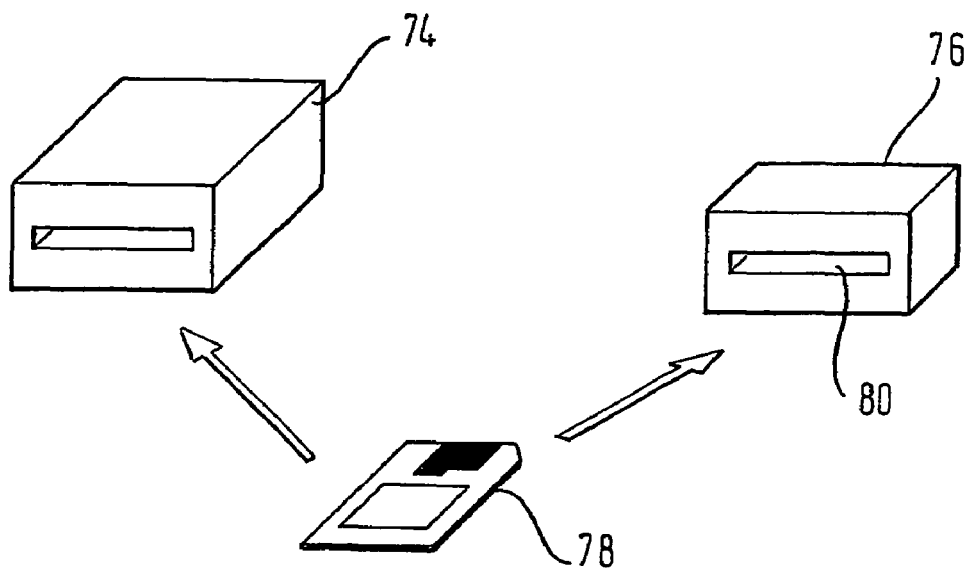
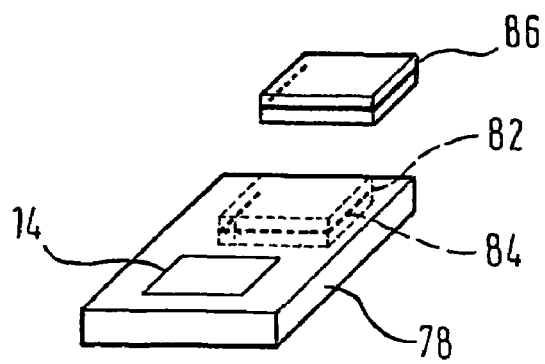
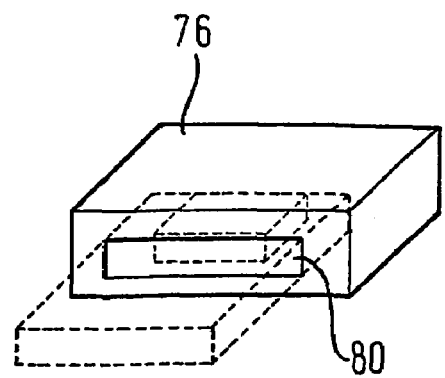

CHIP CARD OF REDUCED SIZE WITH BACKWARD COMPATIBILITY AND ADAPTER FOR A REDUCED SIZE CHIP CARD

FIELD OF INVENTION

The present invention relates to a smaller chip card, and in particular to a smaller chip card with backward compatibility and an adaptor for portability of the smaller chip card.

BACKGROUND OF INVENTION

Patent abstracts of Japan, vol. 016, no. 440 (M-1310), 14 Sep. 1992 and JP 04 153097 relate to the provision of two IC chips which are arranged mutually symmetrically on a chip card, wherein the symmetry is achieved with respect to the insertion direction. This allows to enhance safety of operation.

DE 199 26 348 A describes a method for manufacturing of mini chip cards and the related arrangement of two mini chip cards on a bearer card, e.g., according to the ID-1 format.

DE 199 22 063 A describes an adapter card in a communication device for a chip card having a means for inserting of a chip card and further an identification means for the chip card. The identification means serves to select the appropriate bus, operative voltage or other parameters.

DE 198 26 428 A describes a chip module having an accommodation body. Here, the chip module may be exchanged in the accommodation body being of ID-1 format.

In FR-A-2 794 264 there is described an adapter for an electronic portable device, in particular chip card, of reduced format ID-001. The chip card may be removed from the adapter through provision of cut outs.

JP 62-255192 A describes an adapter wherein a smaller IC card may be reversibly attached to and removed from.

FR-A-2 771 199 describes a portable chip card and a related processing system wherein a selecting means allows to selectively couple one of two smaller IC chip cards with a further contact field.

U.S. Pat. No. 6,151,511 describes an adapter for integrated circuit cards for cellular telephones having specially separated first and second areas for electrical connection according to different connection standards.

EP 1 052 590 A1 describes a card connection adapter to be used for connecting a card slot compliant with a first standard to a card compliant with a second standard by fitting the card in the card slot.

In mobile communication systems, e.g. the PDC, the GSM, or IMT 2000 mobile communication system, subscriber identity modules SIM also referred to as chip cards or smart cards in the following are provided with different card formats. A first format ID-1 shown in FIG. 1 is of larger size and therefore facilitates the handling of chip cards. Another format also shown in FIG. 1 is ID-000 provided for plug in chip cards and allows a significant reduction in size. Chip cards in the ID-1 format may be scored to allow break out an ID-000 card.

As shown in FIG. 2, chip cards usually have eight contacts, which are either used for voltage supply Vcc, reset input RST, clock CLK, ground GND, program voltage Vpp, input/output for serial communication I/O or reserved for future use RFU. The ISO standard 7816-1, 2 is one example for a specification of the position, the minimal size, and the usage of each contact. In mobile communication systems chip cards as illustrated above contain subscriber numbers and authentication algorithms.

In a more general sense, chip cards will also be referred to as universal integrated circuit cards UICC, e.g., as described in ETSI TS 102.221.

One problem with available solutions is that the ID-000 format more and more restricts mobile terminal design, as the size of these mobile terminals becomes smaller and smaller.

Another problem in view of the introduction of smaller chip cards into the mobile communication network market is inter-operability with existing chip card readers/writers, e.g., for initialisation and personalization when the chip card is issued or passed to the end user, and further inter-operability with mobile terminals. It should be noted, that existing chip card readers/writers are also referred to as legacy chip card readers/writers in the following and existing mobile terminals will be referred to as legacy mobile terminals.

In particular, backward compatibility issues with legacy mobile terminals are more important than the ones for other system components, because it is impossible to replace legacy mobile terminals at the end user side.

Yet another problem not addressed so far is the portability and handling of smaller chip cards for end users which gets more and more difficult with reduced size of the smaller chip cards. At the time of introduction of plug-in format ID-000—in addition to ID-1 which is still commonly used as banking/credit/telephone card format—, the excessive plastic compared to ID-1 was simply cut off and electrical contacts were kept as they were. This approach to portability will no longer work with smaller chip cards, as the dimensions thereof will simply be too small for direct handling through the end user.

SUMMARY OF INVENTION

In view of the above, an object of the present invention is to achieve backward compatibility for smaller chip chards with legacy equipment, in particular legacy card readers/writers or legacy mobile terminals.

A further object of the present invention is to achieve a mechanism for convenient portability.

To achieve these objects, according to the present invention there is provided a smaller chip card having the features of claim 1.

It should be noted that the smaller chip card in the sense of the present invention is not restricted to a particular type of application, and may therefore also be referred to as portable electronic devices in a more general sense.

According to the present invention, it is proposed that the integrated circuit chip is physically and electrically connected, both, to the second contact area and also to contacts of the first contact area to achieve backward compatibility.

Therefore, the present invention allows to have two independent contact areas on the portable electronic device, the one being for standard compatibility and the other one being freely designable without restrictions imposed through preexisting standards. Through the double connection of the integrated circuit chip to two different contact areas, backward compatibility is not only achieved in a mechanical sense—i.e., such that the new portable electronic device may be inserted in legacy equipment—but also on an electrical level through connection of the integrated circuit chip to the first contact area being provided in compliance with a standard. This connection allows for operation of the smaller chip and with legacy equipment.

Further, the present invention allows to achieve backward compatibility to different types of legacy equipment, i.e. legacy equipment adapted to ID-1 format or ID-000 format.

Preferably, the standard for defining the first contact area may be one standard selected from, e.g., ISO 7816-1, 2, ETSI UICC TS 102.221, ETSI GSM TS 11.11, TETRA TS 100 812-2/EN 300 812, ARIB PDC SDR-27, 3GPP TS 31.101, and 3GPP2 TR45.

Therefore, backward compatibility is achieved irrespective of the type of application only in view of standards defining contact position and geometries. Typical examples would be backward compatibility in view of standards which are used in mobile communication systems, or further in view of standards used for banking/credit/telephone cards, e.g., ISO 7816-1, 2.

According to another preferred embodiment of the present invention the card body format of the portable electronic device is ID-1, the standardized first contact area is placed within an ID-000 part of the card body and the smaller chip card is placed outside the ID-000 part of the card body.

A first advantage of this preferred embodiment is that it is possible to achieve backward compatibility also with plug-in chip cards. Therefore, legacy chip card readers/writers and legacy terminals may use contacts according to ISO 7816-1, 2 while the actual electrical interfaces are realized in the smaller chip card.

According to a further preferred embodiment of the present invention the contact area and the smaller chip card are provided on the same surface of the card body. Alternatively, the contact area provided according to pre-existing standards and the smaller chip card are arranged on different surfaces of the card body.

Therefore, design flexibility is maximized as the side where the smaller chip card is provided on the card body is independent from the side of the contact area provided according to pre-existing standards.

The present invention as outlined so far relates to a single chip solution where a standardized contact area and a smaller chip card are provided on a card body.

A further aspect of the present invention relates to portability of the smaller chip cards or in other words the handling of the smaller chip card through the end user.

According to the present invention there is provided a chip card adaptor according to claim 11, or adaptor in short, of format ID-000 which is adapted to handle a smaller chip card with dimensions smaller than ID-000.

The smaller chip card can be separated from the adaptor and then be re-coupled to the adaptor, i.e. either with a legacy type of equipment or with a mobile terminal specifically designed for the smaller chip card. Alternatively, the smaller chip card may be coupled to the adaptor for an one-time attachment.

Preferably, the adaptor is provided with a contact area according to a predefined standard, e.g., ISO 7816-1, 2, ETSI UICC TS 102.221, GSM 11.11, TETRA TS 100 812-2/EN 300 812, ARIB PDC SDR-27, 3GPP TS 31.101, and 3GPP2 TR45 to achieve backward compatibility.

According to a further embodiment of the present invention the chip card adaptor has a U-shaped cut out for accommodation of the smaller chip card. The lateral edge of this cut-out which gets into contact with the smaller chip card has a profile according to the lateral edge profile of the smaller chip card. The profile may be a ditch profile or a projection profile.

According to a further preferred embodiment of the present invention the chip card adaptor is provided with contacts in the area where it gets in contact with the smaller chip card, e.g., at the lateral edge of the cut-out towards the lateral edge of the smaller chip card.

This allows to maintain backward compatibility after re-coupling of the smaller chip card to the chip card adaptor.

A further aspect of the present invention relates to a smaller chip card according to independent claim 17 being specifically adapted for portability.

The card body of the smaller chip card has a format with dimensions smaller than ID-000 and a chip card area with an integrated circuit chip connected physically and electrically to contacts of a contact area of the smaller chip card. This aspect of the present invention relates to a chip card body for the smaller chip card with an edge specifically adapted to connect the smaller chip card to a chip card adaptor.

The lateral edge is a profiled lateral edge and may have contacts for connecting the contacts of the contact area of the smaller chip card to an external adaptor for backward compatibility through the chip card adaptor.

A further aspect of the present invention relates to a terminal interface having the features of independent claim 22 and being provided for a smaller chip card having dimensions smaller than ID-000 and being handled with a chip card adaptor according to the present invention.

The terminal interface has an opening for inserting the chip card adaptor. Therefore, the opening of the terminal interface may be wider than the smaller chip card itself, e.g., be adapted to accommodate an ID-000 type chip card adaptor.

Further, the terminal interface has a locking unit adapted to separate the smaller chip card from the chip card adaptor through mechanical engagement with the smaller chip card when the terminal interface is operated in a locking mode, e.g., by pressing the smaller chip card down after it has been inserted into the opening of the terminal interface.

Preferably, the terminal interface may also be operated in an unlocking mode through an unlocking unit adapted to push the smaller chip card towards the chip card adaptor in the unlocking mode. Once the smaller chip card is reconnected to the related chip card adaptor, it may be removed through the opening of the terminal interface.

Preferably, the terminal interface comprises an interface allowing for determination of the locking or unlocking mode through the user of the terminal interface. The terminal interface may either be achieved in a mechanical way or supported by software.

As outlined above, the different aspects of the present invention allow for backward compatibility of a smaller chip card not only in the sense of chip card format, e.g. ID-1 or ID-000, but also in view of electrical contacts defined according to a predefined standard and therefore on an operative level.

At the same time, no restrictions for the design of smaller chip card are imposed leading to a minimal size of the smaller chip card. Portability is guaranteed through appropriate mechanisms for handling the smaller chip card and through provision of appropriate terminals for handling the smaller chip card.

DESCRIPTION OF DRAWING

In the following preferred embodiments of the present invention will be described with reference to the drawing:

FIG. 23 shows a cross sectional view of a portable electronic device with backward compatibility;

FIG. 24 shows a cross sectional view of a further portable electronic device with backward compatibility; and FIG. 25 shows portability mechanisms suitable for a smaller chip card according to the present invention and a smaller chip card provided with a fixing for coupling to a related chip card adaptor.

DESCRIPTION OF PREFERRED EMBODIMENTS

In the following preferred embodiments of the present invention will be described with reference to the drawings.

Heretofore, reference will be made to smaller chip cards.

Figure 1:
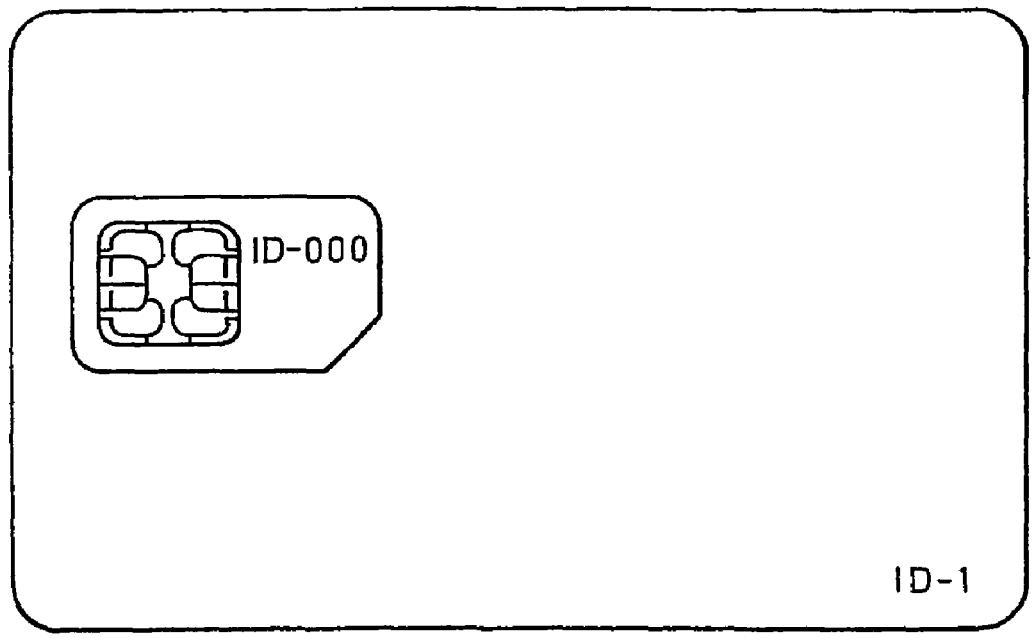
FIG. 1 shows the ID-1 and ID-000 chip card format as usual chip card formats.
Figure 2:
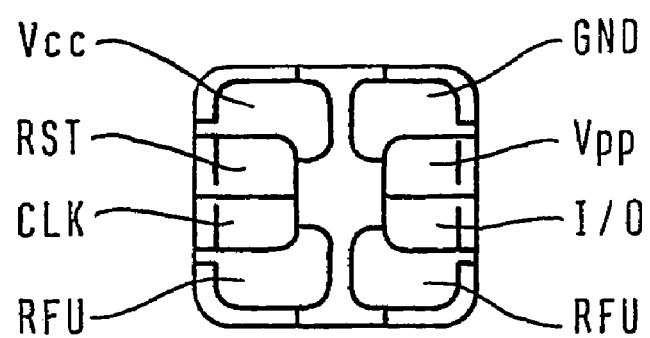
FIG. 2 shows the arrangement of contacts in compliance with ISO 7816-1, 2 as example for a standard defining an arrangement and dimensions of contacts.
Figure 3:
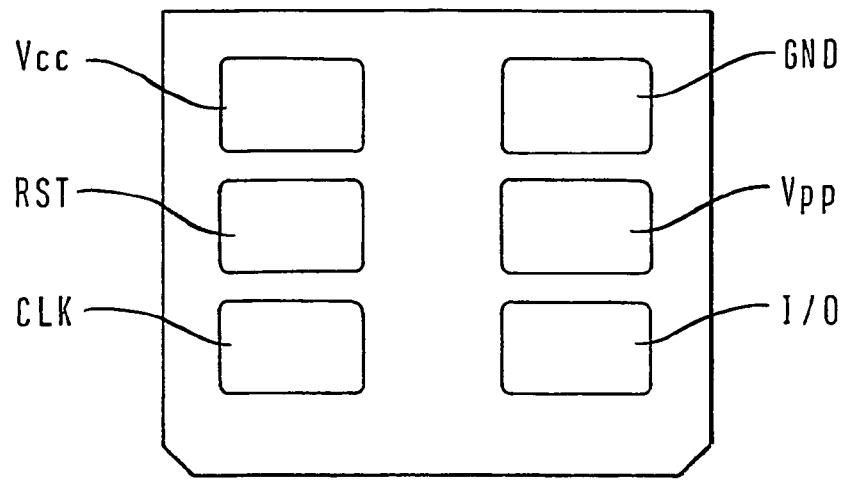
FIG. 3 shows a first example for a smaller chip card having geometrical dimensions smaller than ID-000 according to the present invention.

A first example for a smaller chip card having dimensions smaller than ID-000 or in other words close to silicon is shown in FIG. 3. Different contacts are arranged along two parallel lines. E.g., the contacts are used for voltage supply Vcc, reset input RST, clock CLK, ground GND, program voltage Vpp, input/output for serial communication I/O. Of course, the ordering of the contacts along the lines may be permutated or one or more contact(s) may be omitted or added.

Figure 4:
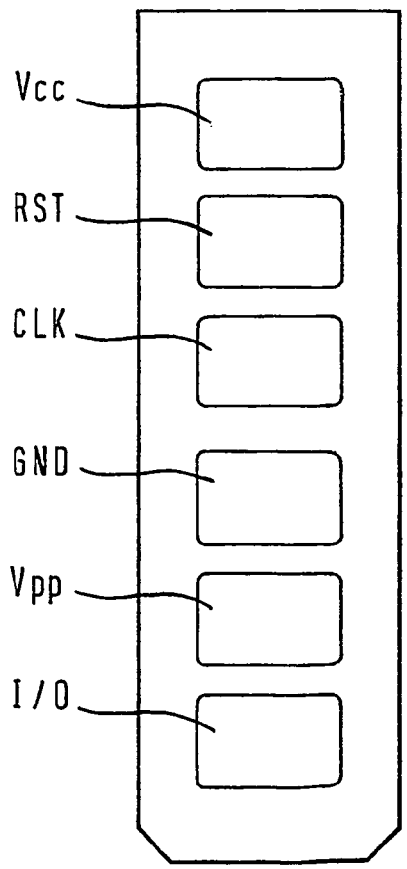
FIG. 4 shows a second example for a smaller chip card having geometrical dimensions smaller than ID-000 according to the present invention.

A second example for a smaller chip card having dimensions close to silicon is shown in FIG. 4. The smaller chip card differs from the smaller chip card shown in FIG. 3 in that contacts are arranged a single line only. Again, the indicated use of contacts is to be considered as an example for the present invention only and may be freely varied, e.g., the ordering of the contacts along the line may be permutated or one or more contact(s) may be omitted or added.

Overall smaller chip cards according to the present invention may understood as smaller universal integrated circuit cards, e.g., smaller UICCs having reduced dimensions, and therefore may also be referred to as portable electric devices in the most general sense.

Figure 5:
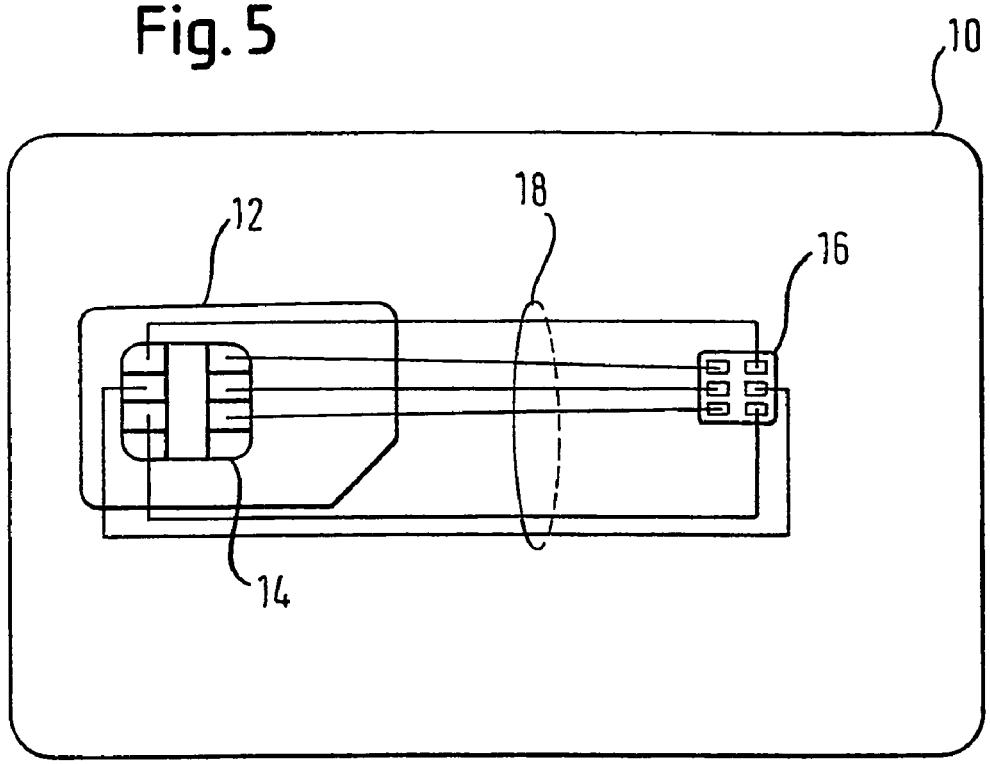
FIG. 5 shows a first example for achieving backward compatibility according to the present invention.

FIG. 5 shows a first example for the portable electronic device according to the present invention. The portable electronic device has a card body 10 in compliance with the ID-1 format. A part 12 of the card body also referred to as plug-in part is arranged according to the ID-000 format. As part of the plug-in part there is provided a contact area in compliance with the pre-defined standards, e.g., ISO 7816-1, 2, ETSI UICC TS 102.221, GSM 11.11, TETRA TS 100 812-2/EN 300 812, ARIB PDC SDR-27, 3GPP TS 31.101, and 3GPP2 TR45.

The contacts arranged in the ID-000 part of the card body 10 will also be referred to as contacts in ID-000 in the following.

Further, as shown in FIG. 5 the card body 10 has a smaller chip card. The smaller chip card 16 comprises an integrated circuit chip placed over a contact area. Although not shown in FIG. 5, the integrated circuit chip may be placed separately from the contact area of the smaller chip card somewhere on the ID-1 chip card.

As shown in FIG. 5, the integrated circuit chip of the smaller chip card is mounted on the contact area of the smaller chip card. Further, the smaller chip card is arranged outside the ID-000 part of the card body. Contacts in the contact area of the smaller chip card are linked to the contacts in the ID-1/ID-000 part via connections 18 which will be explained in the following with reference to FIGS. 14 and 15. Therefore, for communication with the smaller chip card the contacts of ID-1/ID-000 may be used to achieve backward compatibility with legacy card reader/writers and/or legacy mobile terminals. Further, the contacts of the smaller chip card may be used for, e.g., new terminals adapted to the design of the smaller chip card.

According to the present invention it is also possible to connect contacts of the smaller chip card with contacts in the ID-000 area reserved for future use. This allows to extend the functionality of the smaller chip card to a data exchange, e.g., according to the USB standard, RS232, etc., for related functionality of the smaller chip card.

The smaller chip card shown in FIG. 5 is in compliance with a single chip solution where a single integrated circuit chip is mounted on the contact area of the smaller chip card. However, the smaller chip card may also be provided as a double chip solution where an additional integrated circuit chip is mounted on the contacts in ID-000.

Figure 6:
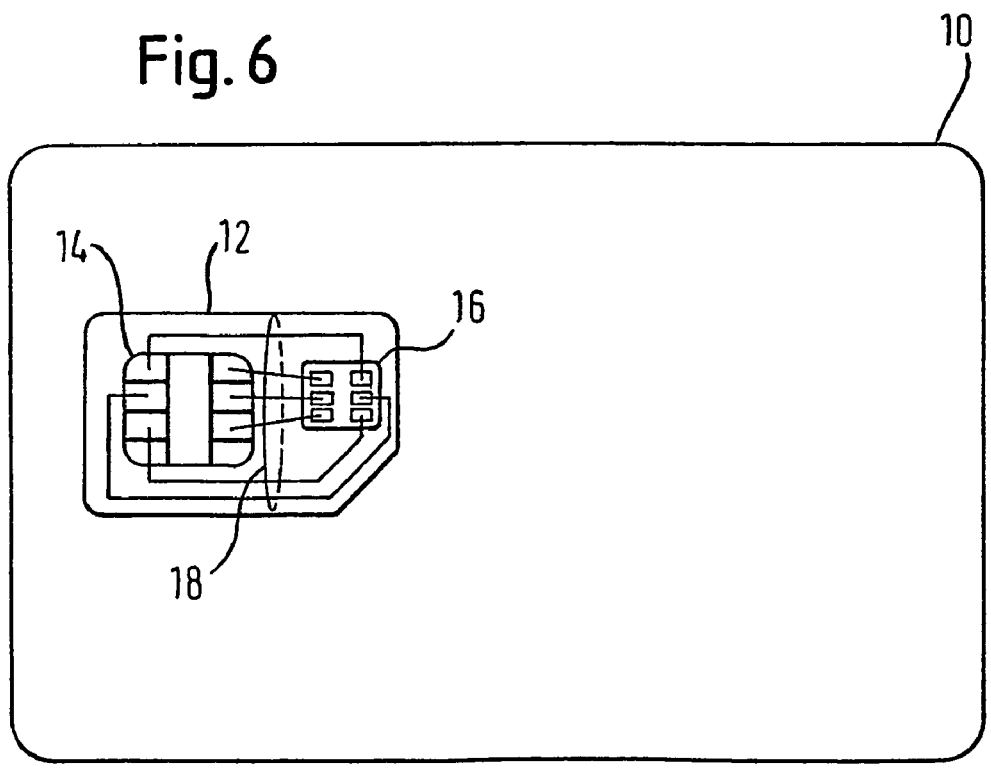
FIG. 6-10 show further examples for achieving backward compatibility according to the present invention.

FIG. 6 shows a second example for a portable electronic device according to the present invention. Those parts corresponding to elements explained previously with respect to FIG. 5 are denoted using the same reference numerals.

As shown in FIG. 6, according to the second example the smaller chip card 16 is arranged within ID-000. Contacts of the smaller chip card 16 are linked with the contacts 14 provided in ID-000 via connections which will be explained further in the following with reference to FIGS. 14 and 15. Therefore, the contacts 14 provided according to pre-existing standards are used as electrical interface to the smaller chip card 16. Therefore, legacy card readers/writers and legacy terminals may use the contacts 14 provided according to pre-existing standards for backward compatibility Even if the ID-000 part is plugged out, it would still work with legacy terminals. Also, the smaller chip card 16 has contacts as electrical interface to terminal equipment adapted specifically to the smaller chip card 16.

Figure 7:
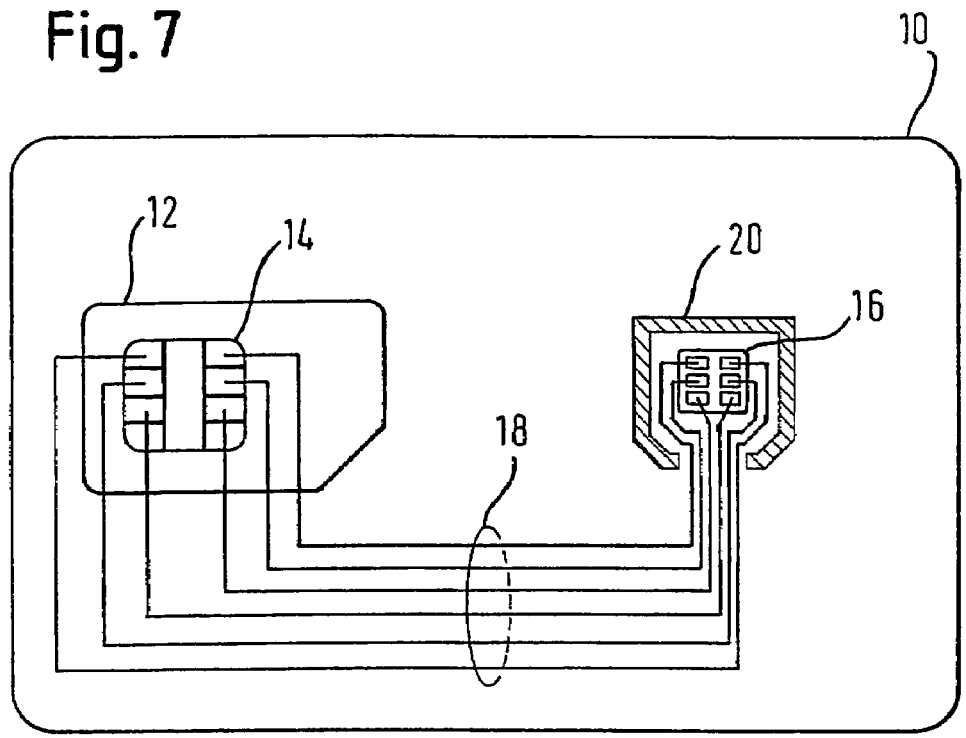

FIG. 7 shows a further example of a portable electronic device according to the present invention, related to the examples shown in FIG. 5. Here, further to the elements explained with respect to FIG. 5 there is provided a punch-out line 20 around the smaller chip card 16 in the ID-1 card body. This allows to remove the smaller chip card from the ID-1 card body for subsequent use of the smaller chip card 16.

Figure 8:
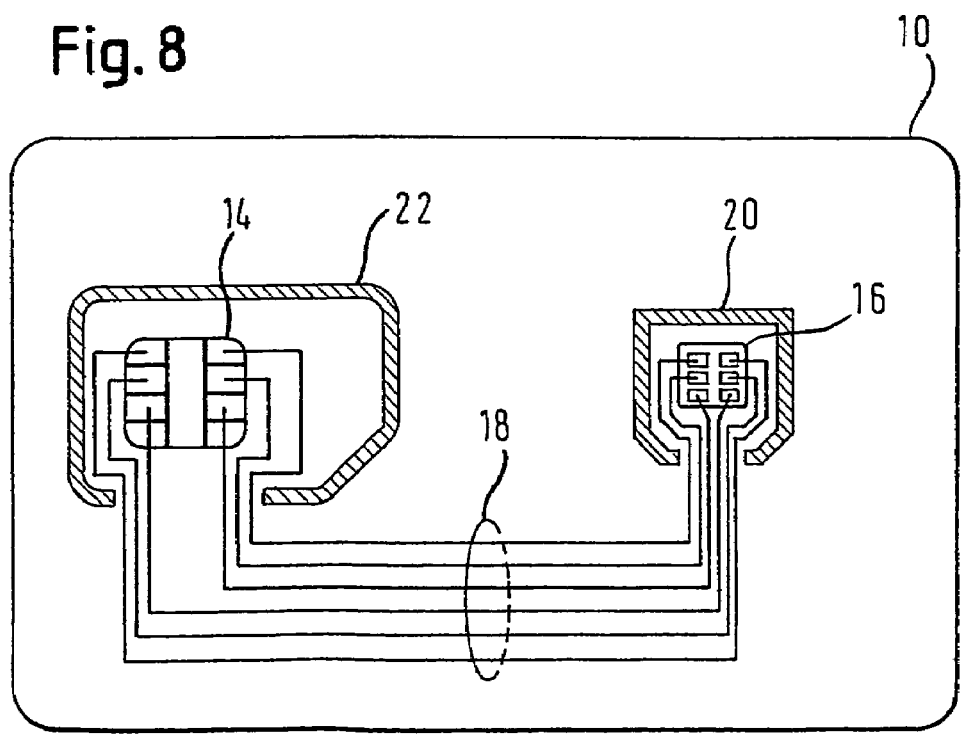

FIG. 8 shows a further example of the electronic portable device according to the present invention. Here, a further punch-out line 22 is provided along the circumference of ID-000. This example is particularly suited for a two-chip solution. In this case, the end user may be provided with the plug-in chip card and the smaller chip card using the ID-1 card and may then either use the ID-000 plug-in chip card or the newly designed smaller chip card after punch out from the ID-1 card. Further, he/she may use both chip cards in combination.

Figure 9:
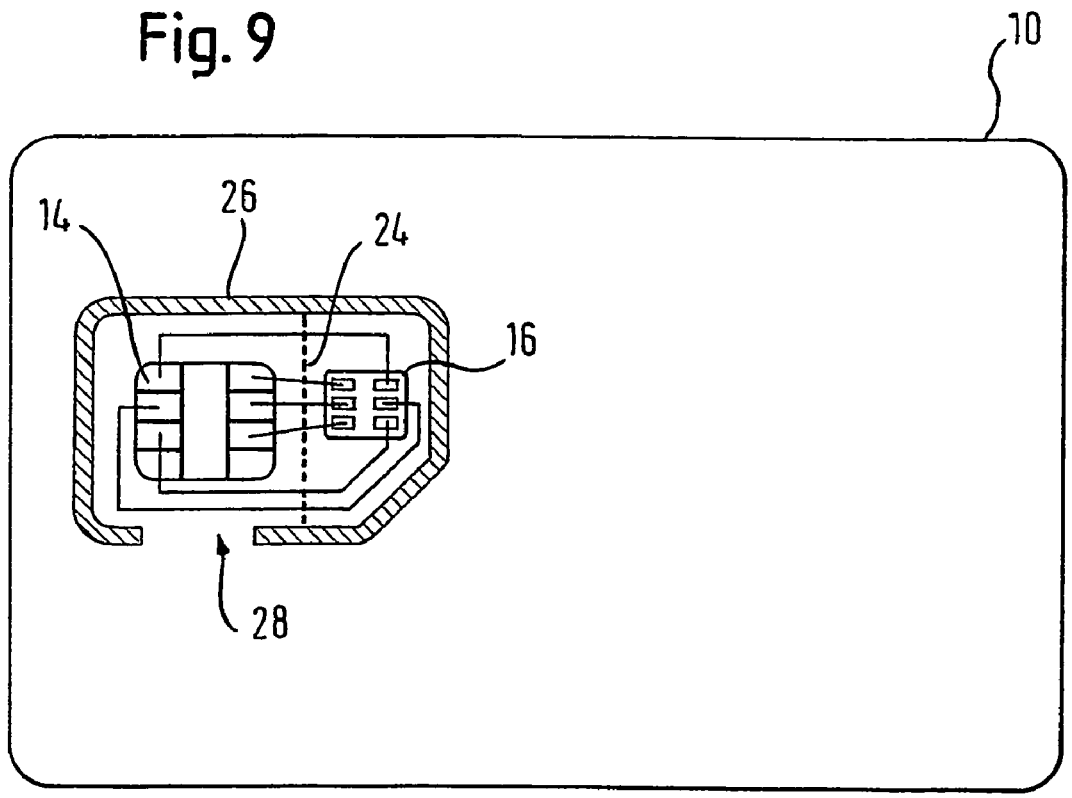

FIG. 9 shows a modification of the electronic portable device shown in FIG. 6. Those parts previously explained are denoted using the same reference numeral.

As shown in FIG. 9, this example relates to the provision of the smaller chip card in ID-000.

There is provided a cutting line crossing the ID-000 part between the ID-000 contacts and the smaller chip card arranged within ID-000. Further, there is provided a punch-out line around the ID-000.

The arrangement shown in FIG. 9 allows for a break-out of the ID-000 part from the card body in ID-1 format. Also, the ID-000 part may be divided using the cutting line. This operation is facilitated when the fixing part 28 remaining for attachment of the ID-000 part to the card body of ID-1 part and the cutting line 24 runs along a different direction, e.g., perpendicular to each other. During removal of the ID-000 part then no force will be applied to the cutting line.

Figure 10:
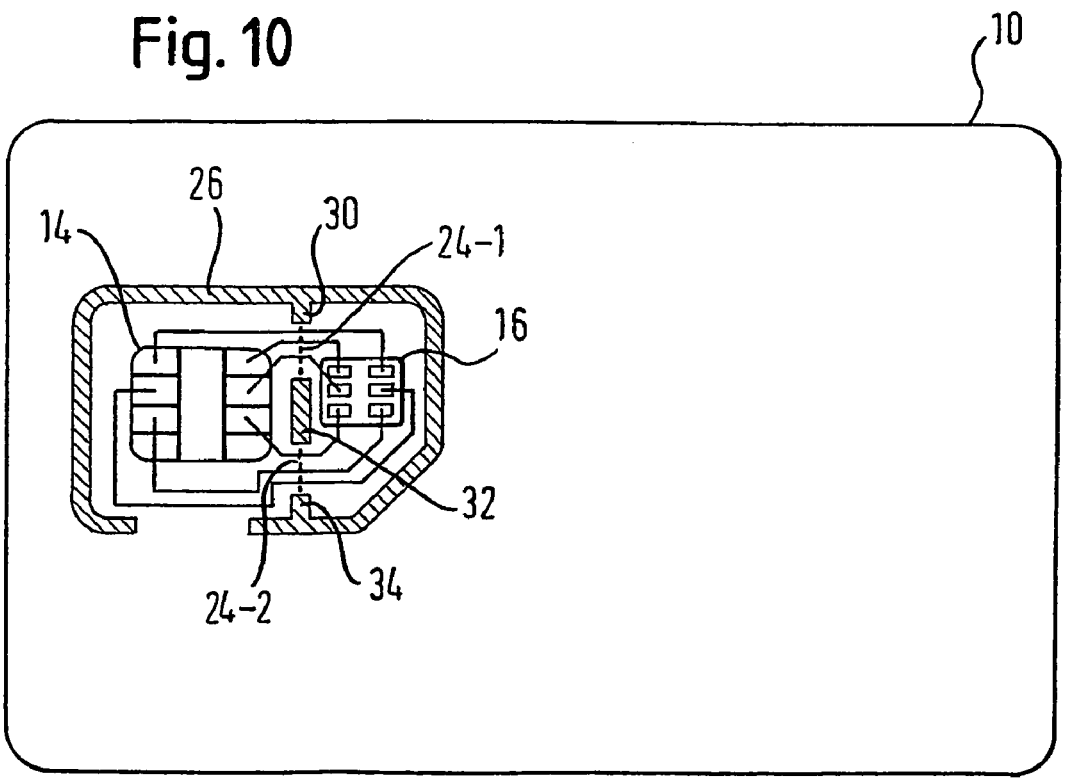

FIG. 10 shows a further example of the portable electronic device according to the present invention. Those parts previously described with respect to FIG. 9 are denoted using the same reference numerals.

As shown in FIG. 10, there are provided punch-outs 30, 32 and 34 along the cutting line 24 for easier partitioning of the ID-000 part. The connections provided for a backward compatibility between the smaller chip card and the contacts provided according to pre-existing standards cross the cutting line in sections 24-1 and 24-2 aside the punch-outs 30, 32 and 34.

The example shown in FIG. 10 facilitates the separation of the smaller chip card from the remaining ID-000 part.

While above examples of the present invention are given with respect to the ID-1 format, the following examples are related to a smaller backward compatibility using ID-000.

Figure 11:
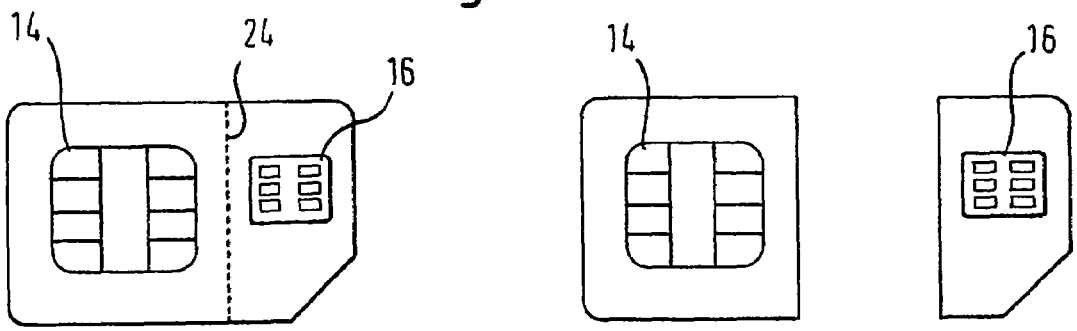
FIG. 11 show an example for a straight cutting line across an ID-000 card body.

As shown in FIG. 11, the provision of an ID-1 card for support of contacts in the ID-000 area and simultaneously a smaller chip card 16 is not mandatory. To the contrary, the ID-000 part may be delivered as such. Optionally, the ID-000 part may be provided with the cutting line as explained previously with respect to FIGS. 9 and 10.

Figure 12:
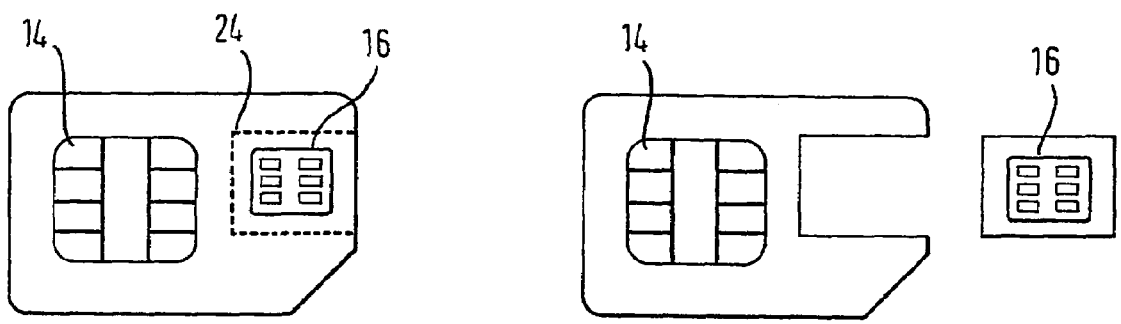
FIG. 12 shows an example for a U-shaped cutting line on an ID-000 card body.
Figure 13:
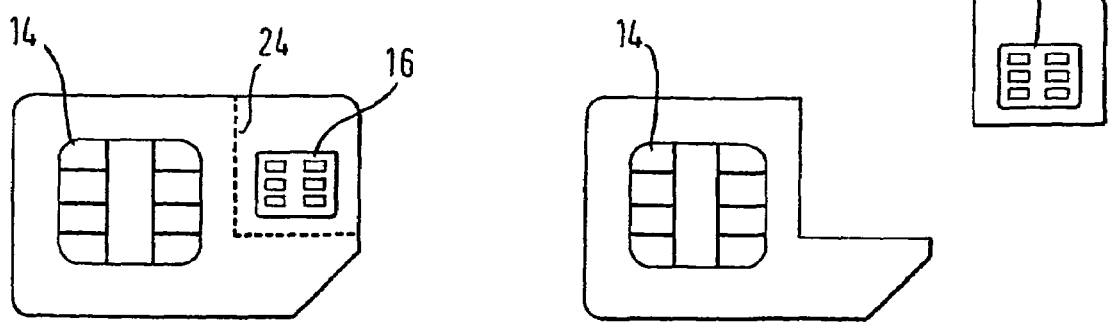
FIG. 13 shows an example for a L-shaped cutting line on an ID-000 card body.

As shown in FIGS. 12 and 13, the cutting line may be U-shaped or L-shaped. In particular, the U-shaped cutting line is well suited for enabling a re-coupling of the smaller chip card 16 to the ID-000 part after separation. The further cutting lines according to FIGS. 9 and 11 are suited for situations where the smaller chip card is distributed with the ID-000 part and is separated only once for subsequent use. While above different aspects of arrangement of ID-000 contacts in combination with a smaller chip card either on a ID-1 card or a ID-000 card have been described with reference to FIGS. 5 to 13, in the following further aspects of achieving backward compatibility will be discussed with respect to FIGS. 14 to 18.

Figure 14:
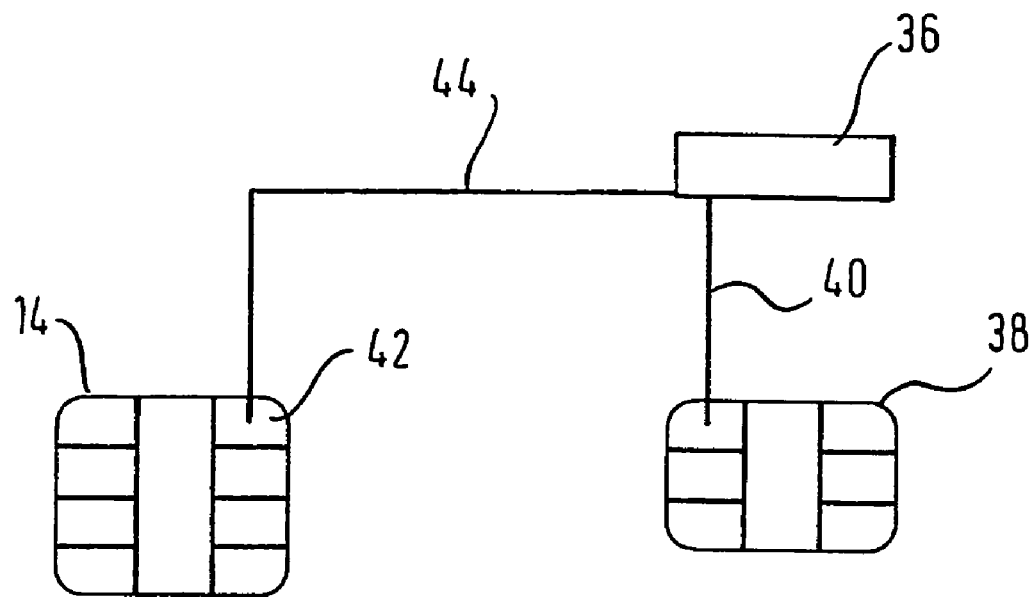
FIG. 14 shows a first example for achieving backward compatibility by physically and electrically linking an integrated circuit chip of a smaller chip card to a newly designed contact area and also to a contact area in compliance with a pre-existing standard.
Figure 15:
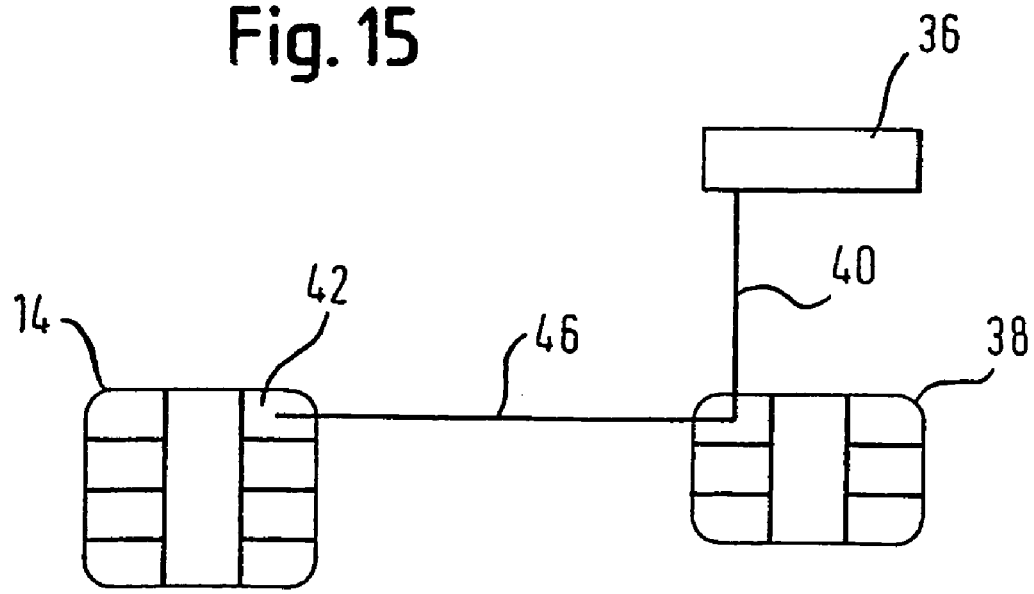
FIG. 15 shows a second example for achieving backward compatibility by physically and electrically linking an integrated circuit chip of the smaller chip card to a newly designed contact area and also to contact area in compliance with pre-existing standards.

FIGS. 14 and 15 are related to a single chip solution.

The ID-000 part has a contact area 14 and the smaller chip card comprises an integrated circuit chip 36 and a further contact area 38. As shown in FIG. 14, the contact area 38 of the smaller chip card has contacts with locations being different from contacts in the contact area 14. Further, also the number of contacts in the contact area 38 may be different from the number of contacts in the contact area 14.

As shown in FIG. 14, the integrated circuit chip 36 of the smaller chip card is bonded to the contact area 38 with a connection 40. Further, the integrated circuit chip 36 is also connected with a related contact 42 of the contact area 14 using a connection 44. Therefore, the connections 40 and 44 are provided separately from each other.

A further example is shown in FIG. 15. The elements described above with respect to FIG. 14 are denoted using the same reference numerals.

According to FIG. 15 the integrated circuit chip 36 of the smaller chip card is not directly connected to the contact area 14. To the contrary, corresponding contacts in the contact area 38 of the smaller chip card and the contact area 14 provided for backward compatibility are linked by a connection 46.

While according to FIG. 15 the connection 46 is provided between corresponding contacts of the contact area 38 of the smaller chip card and the contact area 14, it may nevertheless also branch off from the connection 40 provided to bond the integrated circuit chip 36 to the contact area 38.

Figure 16:
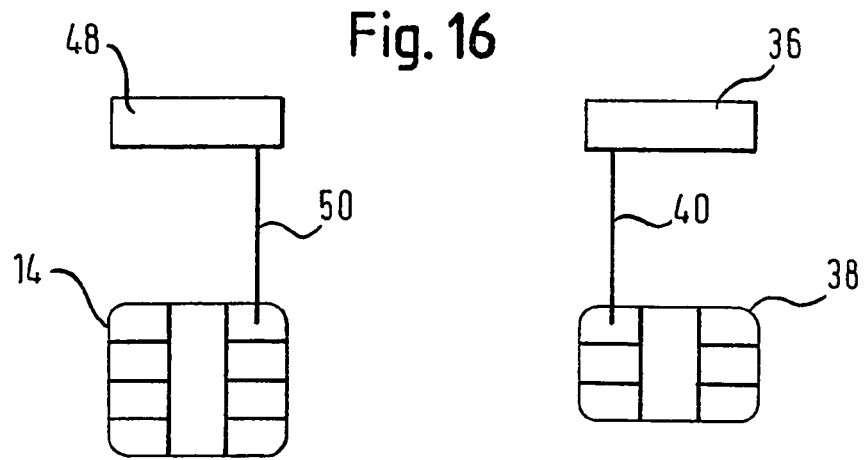
FIG. 16 shows an example for a two chips portable electronic device where integrated circuit chips are connected to separate contact areas.
Figure 17:
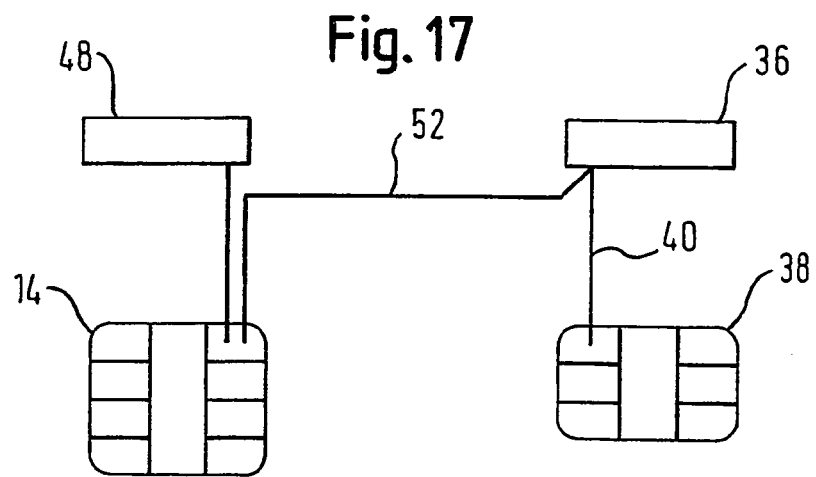
FIG. 17 shows a further example for a double chip solution where integrated circuit chips are connected to different contact areas and, the integrated circuit chip of the smaller chip card is connected for backward compatibility.
Figure 18:
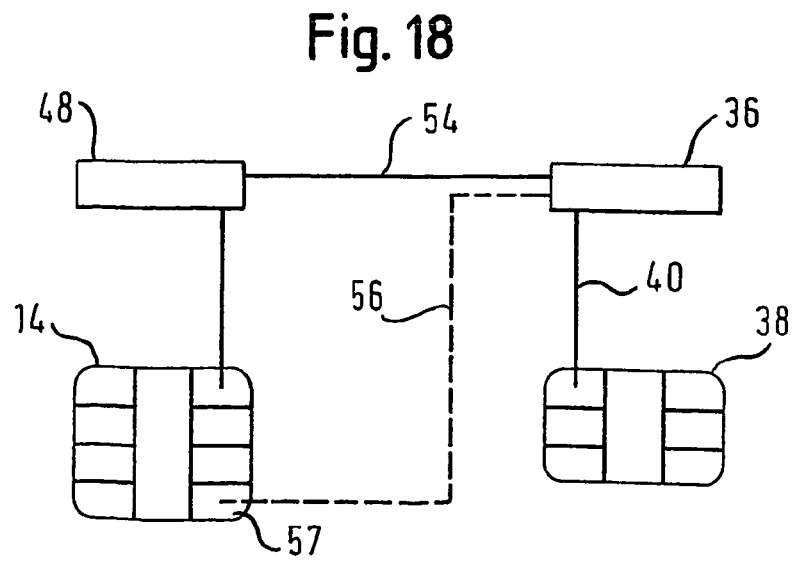
FIG. 18 shows a further example for a double chip solution where integrated circuit chips are connected to different contact areas, and, the integrated circuit chip of the smaller chip card is connected for backward compatability.

Further examples for connection patterns for a double chip solution of the portable electronic device according to the present invention are shown in FIGS. 16 to 18. Those elements described above with reference to FIGS. 14 and 15 are denoted with the same reference numerals.

As shown in FIG. 16, in addition to the integrated circuit chip 36 of the smaller chip card there is provided an additional integrated circuit chip 48 being bonded to the contacts in ID-000 using a connection 50. For the example shown in FIG. 14, there is provided no connection from the integrated circuit chip 36 of the smaller chip card to the contact area 14. Nevertheless, the related smaller chip card is backward compatible as an integrated circuit chip is provided also in relation to the contact area 14 in ID-000.

According to the double chip solution shown in FIG. 16, the two integrated circuit chips operate independently. The external terminal system or the card reader/writer handle activation or coordination of inter-operation thereof, e.g., copy of information from one integrated circuit chip to another.

A further example is shown in FIG. 17. Here, further to the example shown in FIG. 14 there is provided an additional connection 52 from the integrated circuit chip 36 of the smaller chip card to a related contact in the ID-000 area for backward compatibility of the smaller chip card.

For the double chip solution shown in FIG. 17 external systems like the terminal or the card reader/writer take responsibility for the relevance and activation of integrated circuit chips 36, 48. In particular, the external system may switch the integrated circuit chips via the contact area 14.

According to a further example shown in FIG. 18 a connection 54 is provided to achieve a backward compatibility from the smaller chip card to the contact area 14. The connection 54 is not connected directly to the contact area 14 but to the integrated circuit chip 48. This allows for data exchange between the integrated circuit chips 48 and 36. Once data generated in the integrated circuit chip 36 of the smaller chip card is available in the integrated circuit chip 48, it may then be forwarded to the related contact in the contact area 14.

A further example shown in FIG. 18 is adapted to connect the integrated circuit chip 36 of the smaller chip card to a contact of the ID-000 contact area 14 which is reserved for further use RFU. This option of the present invention allows, e.g., for data transmission according to RS232 or USB via the reserved contact.

While different examples to achieve backward compatibility have been explained with respect to FIGS. 14 to 18, in the following further details for realizing connections will be explained with respect to FIGS. 19 to 22.

One option to realize connections for backward compatibility is based on a card body with a multi-layer structure, i.e. having a plurality of films.

Figure 19:
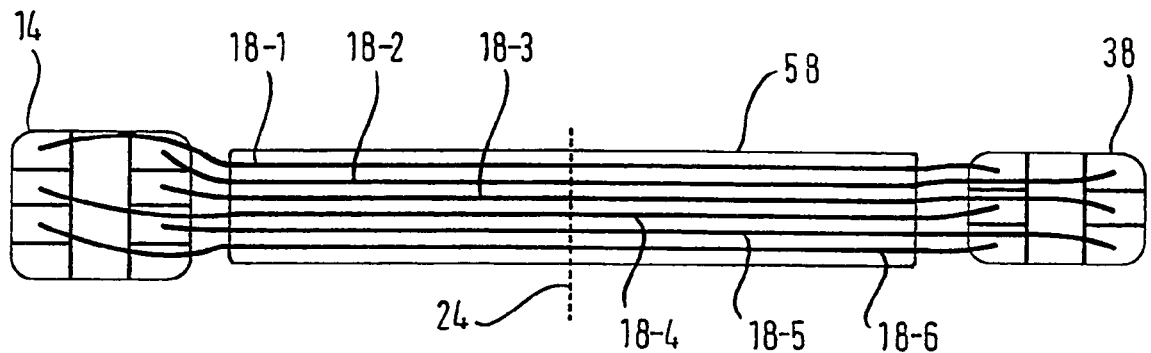
FIG. 19 shows an example of the connectors provided between the contact area of the smaller chip card and the contact area arranged according to FIG. 14 or 15.

As shown in FIG. 19, the connections between the contact area 38 of the smaller chip card and the contact area 14 provided for backward compatibility are realized through a number of wires/conductors 18-1, . . . , 18-6 on one of the films 58. The wires/conductors may be provided on only one side of the film or on both sides of the films or on different films.

For the example shown in FIG. 19, it is assumed that the contact area 38 for the smaller chip card has contacts Vcc, RST, TLK, GND, Vpp, I/O in accordance with ISO 7860-1, 2 and each contact in the contact area 38 is connected for backward compatibility with the contact area 14.

Figure 20:
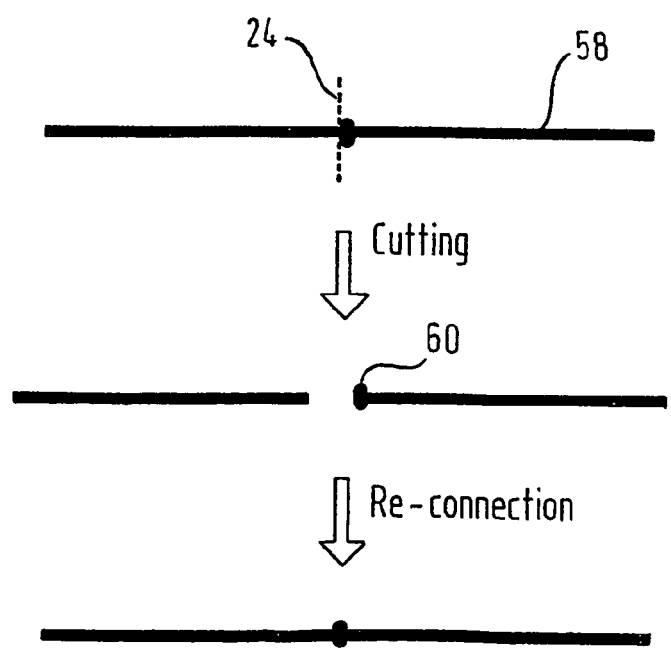
FIG. 20 shows contacts provided in a conductor between the smaller chip cards and the contacts arranged on ID-000.

As shown in FIG. 20, the conductors provided on the film 58 may pass the cutting line explained above and shown in FIGS. 9 to 13. In particular, for achieving a separation and a re-connection of each conductor 18-1, . . . , 18-6 one side of each conductor would have a wider surface 60 for re-connection. Alternatively, both sides may be provided with a wider surface.

In the following further details of mounting the integrated circuit chip of the smaller chip card on the related contact area will be explained referring to FIGS. 21 and 22.

Figure 21:
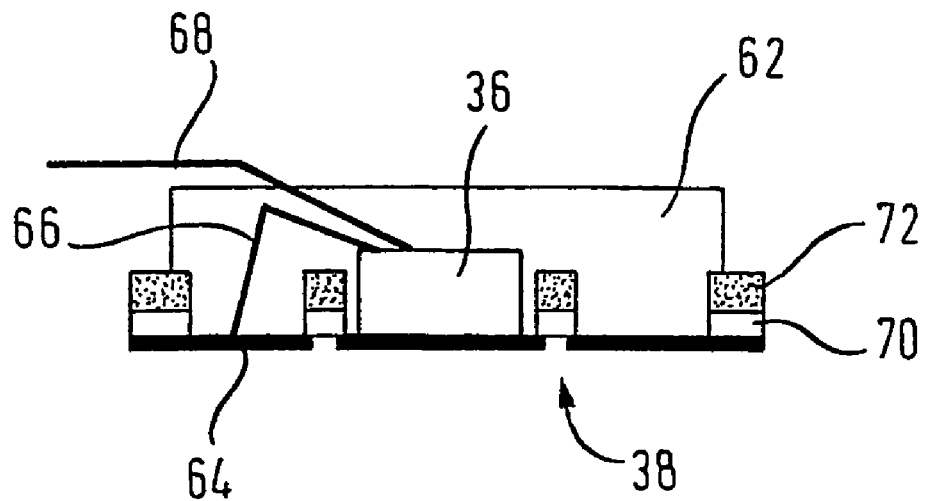
FIG. 21 shows a first example for bonding the integrated circuit chip of the smaller chip card so as to achieve backward compatibility.

As shown in FIG. 21, the integrated circuit chip 36 of the smaller chip card is embedded into a die-coating 62. The integrated circuit chip 36 is bonded to a contact 64 of the contact area 38 with a bonding wire 66. To achieve backward comparability, a further bonding wire 68 branches off to the related contact of the contact area 14 on ID-000. Further elements shown in FIG. 21 are a laminate glue 70 and a glass epoxy element 72.

Figure 22:
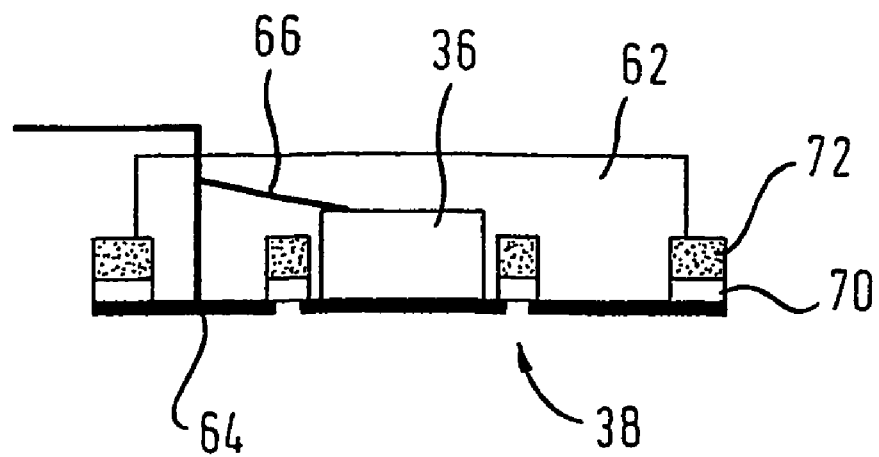
FIG. 22 shows a second example for bonding the integrated circuit chip of the smaller chip card so as to achieve backward compatibility.

A further example for mounting achieving the integrated circuit chip of the smaller chip card is shown in FIG. 22. Those elements described previously with respect to FIG. 21 are denoted using the same references numerals.

The example shown in FIG. 22 is different from the one previously described in that the bonding wire 66 branches off to the related contact of the contact area 14 on ID-000.

While for the examples shown in FIGS. 21 and 22 only a single bonding wire is shown, it is to be understood that the number of wires to achieve backward compatibility is determined by the number of contacts of the smaller chip card.

Further details of a portable electronic device with a smaller chip card and backward compatibility will be explained with reference to FIGS. 23 and 24. Elements previously explained with respect to FIGS. 21 and 22 will be referenced using the same reference numerals.

As shown in FIG. 23, the card body 10, e.g., according to ID-1 or ID-000, is provided to support both the contact area 14 provided for backward compatibility and the contact area 38 in relation to the smaller chip card. The cross sectional view shows two contacts 14-1 and 14-2 for the first contact area and two contacts 38-1 and 38-2 for the contact area of the smaller chip card.

Supplement to the explanations given with respect to FIGS. 21 and 22, FIG. 22 shows how conductors 68-1 and 68-2 branch off from contact areas 38-1 and 38-2, respectively, to the contact 14-1 and 14-2 to achieve backward compatibility.

As shown in FIG. 23, the cutting line 24 is provided as a notch. The conductors 68-1 and 68-2 cross the cutting line in that part of the card body 10 that is not removed to form the notch. It should be noted that also the provision of bonding wires branching off as shown in FIG. 22 may be applied to the structure shown in FIG. 23.

FIG. 24 shows a further example for the electronic portable device having a smaller chip card with backward compatibility. Those elements explained previously with respect to FIG. 23 are denoted using the same reference numerals.

The example shown in FIG. 24 differs over the example in FIG. 23 in that the die-coating 62 is not only provided in the surroundings of the integrated chip 36 of the smaller chip card but is extended in the chip card body 10 to the contact area 14. The die-coating may be covered with a hot melt foil 72.

As shown in FIG. 24, according to this further example the conductors 68-1 and 68-2 are not running in the card body 10 but in the die-coating 62.

In the following further aspects of the present invention being related to portability of the smaller chip card and a related terminal will be explained with reference to FIG. 25.

Generally, the structure shown in FIG. 25 provides a chip card interface terminal 76, also referred to as interface terminal in the following, adapted to separate a smaller chip card from an adaptor 78 when inserted in the terminal 76. Further, the smaller chip card may be attached to the adaptor 78 again after use of the smaller chip card. Thus, the adaptor allows easy handling of the smaller chip card. Further, the adaptor may support backward compatibility in the sense outlined above, so that legacy terminals may accept a smaller chip card attached to the adaptor.

As shown in FIG. 25, there may be provided different interfaces for the smaller chip card, i.e. a UICC interface in a legacy terminal 74 and a UICC interface in a new terminal 76.

The smaller chip card with the adaptor 78 may be inserted into the legacy terminal 74. Further, the new terminal 76 for the smaller chip card may be reduced in depth, even if the width and height of its opening 80 is the same as that of the legacy terminal 74. This allows to make new terminals smaller and supplies flexibility in terminal design, i.e. mobile terminals.

In the following the structure of the chip card adaptor will be explained in more detail.

The chip card adaptor may have a format ID-000 for legacy terminals. For inter with the new terminal 76 it should have a fixing which allows to remove the smaller chip card from the chip card adaptor 78 for use within the new terminal 76 and then to attach the smaller chip card to the chip card adaptor 78 again. Alternatively, the fixing may achieve one-time attachment.

As shown in FIG. 25, one way to achieve this is to provide the chip card 78 with a cut out 82 at one side thereof. The lateral edge of the cut out 82 gets into engagement with the lateral edge of the smaller chip card during attachment of the smaller chip card to the chip card adaptor 78. Fixing of the smaller chip card to the chip card adaptor is achieved by providing the lateral edge of the cut out 82 with a profile and by providing the lateral edge of the smaller chip card 78 with a profile that is the counter part of the profile of the lateral edge of the cut out 82. One option is to provide the lateral edge of the cut out 82 with a ditch profile 84 and the lateral edge of the smaller chip card with a projection 86 or vice versa.

An alternative to the approach using a profile would be to provide pins, e.g., at the front of the cut out 82 which pins get into engagement with hollow spaces formed in the smaller chip card.

Further, the adaptor 78 may be provided with contacts according to ISO 7816-1, 2 for backward compatibility. In this case, connectors provided for backward compatibility pass the lateral edge of the cut out 84 via related contacts (not shown in FIG. 25).

The lower part of FIG. 25 shows further details of the new terminal 76 for handling the smaller chip card with the adapter 78. The new terminal 76 has an opening 80 with a width according to ID-000. Further, the new terminal 76 comprises a hardware mechanism adapted to press down only a smaller chip card part of the adaptor/smaller chip card combination inserted into the opening 80. For operating the new terminal 76 in an unlock mode, the new terminal 76 has a hardware mechanism to insert the smaller chip card part back into the adaptor 78. E.g., at the bottom of the terminal interface there may be provided a pusher adapted to push the smaller chip card back into the cut out 82 of the adaptor 78. After re-insertion of the smaller chip card into the adaptor 76 the adaptor together with the smaller chip card may then be removed from the new terminal 76 for further handling.

Overall, the operation of the new terminal shown in FIG. 25 may be divided into the following sub-steps: A smaller chip card with an adaptor 78 is inserted into a new terminal 76 for the smaller chip card. Then, the mode of the new terminal 76 is set to "lock", so that the smaller chip card is pressed down. Hereafter, the adaptor 78 is removed from the new terminal 76 and after operation of the new terminal 76 the adaptor 78 may be inserted again into the new terminal. Here, the new terminal 76 will be set into the "unlock" mode which means that the smaller chip card part is pushed by the button of the terminal interface mechanism to remove the smaller chip card into the adaptor 78. The "lock/unlock" mode of the new terminal may be determined by the user either using a related button of the terminal 76 or through a terminal interface being suitable programmed, i.e. via interface software.

The invention claimed is:

1. A portable electronic device, comprising:
   a card body;
   a first contact area having dimensions and locations of contacts according to a predefined standard;
   characterized by
   a chip card area with an integrated circuit chip physically and electrically connected to contacts of a second contact area, locations of contacts in the second contact area being different from locations of contacts in the first contact area; wherein
   the integrated circuit chip in the chip card area is also connected to contacts of the first contact area,
   a first punch out line is provided at a circumference of the first contact area leaving at least one segment un-punched for reversibly fixing the first contact area to the card body, and
   a second punch out line is provided at a circumference of the second contact area leaving at least one segment un-punched for reversibly fixing the second contact area to the card body.

2. A portable electronic device according to claim 1, characterized in that the integrated circuit chip is connected to contacts of the first contact area through connections which are provided separately from connections for connecting the integrated circuit chip to contacts of the second contact area.

3. A portable electronic device according to claim 1, characterized in that the integrated circuit chip is connected to contacts of the first contact area through connections linking contacts in the second contact area with corresponding contacts in the first contact area.

4. A portable electronic device according to one of the claims 1 to 3, characterized in that the predefined standard defining dimensions and locations of contacts in the first contact area is selected from a group comprising ISO 7816-1, 2, ETSI UICC TS 102.221, GSM 11.11, TETRA TS 100 812-2/EN 300 812, ARIB PDC SDR-27, 3GPP TS 31.101, and 3GPP2 TR45.

5. A portable electronic device according to claim 1, characterized in that the card body format is ID-1, the first contact area is placed within an ID-000 part of the card body, and the chip card area is placed outside the ID-000 part of the card body.

6. A portable electronic device according to claim 5, characterized in that the first punch out line is provided at a circumference of the ID-000 part.

7. A portable electronic device according to one of claims 1, 2, 3, 5, or 6, characterized in that the first contact area and the chip card area are provided on the same surface of the card body.

8. A portable electronic device according to one of claims 1, 2, 3, 5, or 6, characterized in that the first contact area and the chip card area are provided on different surfaces of the card body.

9. A portable electronic device according to one of claims 1, 2, 3, 5, or 6, characterized in that the chip card body has a multi-layer structure.

10. A portable electronic device according to claim 9, characterized in that connections are realized as physically separated and electrically isolated wires on a layer of the multi-layer structure or on different layers of the multi-layer structure.

11. A terminal interface for a smaller chip card handled with a chip card adaptor of ID-000 format, characterized by:
    an opening for inserting the chip card adaptor, and
    a locking unit adapted to separate the smaller chip card from the chip card adaptor through mechanical engagement with a smaller chip card part of the chip card adaptor in a locking mode.

12. A terminal interface according to claim 11, characterized in that the locking unit is adapted to press the smaller chip card part of the chip card adaptor down.

13. A terminal interface according to claim 11 or 12, further comprising an unlocking unit adapted to push the smaller chip card into engagement with the chip card adaptor in an unlocking mode.

14. A terminal interface according to claim 13, further comprising a terminal interface allowing determination of the lock or unlock mode.

* * * * *